United States Patent [19]
Klein

[11] Patent Number: 5,721,673
[45] Date of Patent: Feb. 24, 1998

[54] SOCKET FOR RETAINING MULTIPLE ELECTRONIC PACKAGES

[75] Inventor: Dean A. Klein, Lake City, Minn.

[73] Assignee: Micron Electronics, Inc., Nampa, Id.

[21] Appl. No.: 539,486

[22] Filed: Oct. 5, 1995

[51] Int. Cl.$^6$ .................... H05K 7/10; H05K 7/12; H01R 13/62

[52] U.S. Cl. .................. 361/809; 361/807; 361/808; 439/342; 439/368

[58] Field of Search ................ 361/807–810; 439/259, 261, 264, 328, 342, 368

[56] References Cited

U.S. PATENT DOCUMENTS

| | | | |
|---|---|---|---|
| 5,367,436 | 11/1994 | Ikei | 361/766 |
| 5,454,727 | 10/1995 | Hsu | 439/342 |
| 5,466,169 | 11/1995 | Lai | 439/259 |
| 5,588,861 | 12/1996 | Townsend | 439/342 |

OTHER PUBLICATIONS

Drawing of voltage regulator module with VRM socket; Amp Incorporated, Mar. 15, 1995.
Spec sheet for "DS1213B SmartSocket 16/64K"; Dallas Semiconductor; undated p. 347.
Spec sheet for "DS1232/S MicroMonitor Chip"; Dallas Semiconductor; undated; p. 722.
Photocopies of Foxconn® VRM Header 7 (Part No. HL91157) and Augat® Socket 5 (Part No. M45010); undated; two sheets.

*Primary Examiner*—Michael W. Phillips
*Assistant Examiner*—John B. Vigushin

[57] ABSTRACT

For use with a printed circuit board (PCB), a socket removably retains a CPU integrated circuit package and a separate voltage regulator module with only one manually-engaged latch. The socket includes a non-moveable member and a moveable member. The non-moveable member interfaces with the PCB and with the voltage regulator module. The non-moveable and moveable members receive the CPU integrated circuit package and the moveable member includes a retaining arm for locking into the voltage regulator module. The moveable member is moved from an unlocked position into a locked position for fixedly securing the CPU integrated circuit package, with the arm securing the voltage regulator module. Other optional features include power plane connectors and decoupling capacitors within the socket.

21 Claims, 3 Drawing Sheets

SOCKET FOR RETAINING MULTIPLE ELECTRONIC PACKAGES

FIELD OF THE INVENTION

The present invention relates generally to sockets for removably retaining electronic circuit cards and integrated circuit packages.

BACKGROUND OF THE INVENTION

Processing of electronic components has advanced to the stage that the outdating of newly-designed electronic devices and systems is expected in a relatively short time period. Customers of such devices and systems are reluctant to purchase such electronic equipment one year, only to find that the equipment will have to be completely replaced shortly thereafter. Computer-based products, for example, desk-top computer stations, have experienced this dilemma over the last few decades.

The computer industry has responded by providing equipment which is specifically designed to be upgraded with more advanced and more powerful technology. By designing equipment that requires replacement of only a few important components, for example, the CPU (central processing unit) and memory chips, the overall computer-based products does not have to be replaced. Thus, in response to an advancement in the processing speed of a newly-designed CPU, or to advancements in the speed and capacity of a newly-designed memory chip, only these specific newly-designed components need to be replaced.

For a variety of reasons, the processing techniques of electronic components have resulted in these newly-designed components requiring different operating-power levels. Using the same example from above, newly-designed memory chips and CPUs require significantly reduced voltage supply levels. In upgrading a computer-based system currently operating from a 5 Volt power supply, for example, a newly-designed, more advanced CPU might require a 3.3 Volt power supply. Consequently, the industry approach of upgrading only the more advanced components has had to be modified by the step of also replacing or adding a power supply.

One of the more recent attempts to provide this type of upgrade for a CPU requires the computer-based equipment being specially designed to include two part-retaining sockets soldered to a printed circuit board (PCB). When the equipment is originally sold, one of these part-retaining sockets removably retains the CPU in a zero-insertion-force (ZIF) socket, and the other removably retains a module comprised of a voltage regulator circuit mounted on a mini-PCB. The PCB which retains each of the sockets includes embedded electrical connections for connecting power pins of the voltage regulator module and the CPU, and includes numerous PCB-mounted decoupling capacitors for the power signals carried in the electrical connections.

Upgrading the CPU with the more advanced technology involves removing the then-installed CPU and voltage regulator module, inserting the upgraded CPU and upgraded voltage regulator module into the respective sockets, and then manipulating various mechanical latches to secure each of these upgraded parts in place.

In connection with the present invention, it has been discovered that this upgrade/design approach is relatively cumbersome from an installation perspective and disadvantageous from a cost and reliability perspective. In terms of installation, the approach requires manipulation of a zero-insertion-force (ZIF) lever attached to the first socket for retaining the CPU therein. The approach further requires manual rotation of two independent levers, which are on the second socket, for retaining the voltage regulator module.

In terms of cost and reliability, it has been discovered that this type of upgrade/design implementation requires an unjustified amount of PCB space and an excessive number of decoupling capacitors. It has further been discovered in connection with the present invention that this upgrade implementation requires an excessive number of moving parts, thereby resulting in unneeded cost, labor and exposure to the potential of component damage due to static shocks.

Accordingly, there is a need for a socket arrangement which can be used in PCB designs and for component upgrades without experiencing the above-mentioned shortcomings.

SUMMARY OF THE INVENTION

Generally, the present invention provides an improved socket/PCB arrangement for upgrading integrated circuit packages requiring special peripheral support circuitry.

In one particular embodiment, the present invention is implemented in the form of a socket for use with a printed circuit board. The socket removably retains and electrically couples an integrated circuit package and a separate electronic item, such as a PCB-based voltage regulator module. The socket is constructed and arranged for interfacing with the separate electronic item, and includes a non-moveable member and a moveable member. The non-moveable member has a plurality of electrical conductors for connecting to the printed circuit board and a plurality of pin-contacting sections for receiving pins extending from the integrated circuit package. The moveable member is constructed and arranged adjacent the non-moveable member, and has a locked position for fixedly securing the integrated circuit package and the separate electronic item and electrically connecting to the non-moveable member. The moveable member further includes an unlocked position for removing the integrated circuit package and the separate electronic item, and a second plurality of pin-contacting sections aligned with the first plurality of pin-contacting sections of the non-moveable member, and a retaining arm for securing the separate electronic item when the moveable member is in the locked position.

In another particular embodiment, the present invention is implemented in the form of a printed circuit board. The printed circuit board has power conductors, a plurality of integrated circuits connected to and operating from the power conductors, a voltage regulator module, and a socket for removably retaining and electrically coupling a selected integrated circuit package, such as a CPU, and the voltage regulator module. The power conductors include a first conductor for carrying a common signal and a second conductor for carrying a main supply voltage signal. The voltage regulator module is connected to the common and main supply voltage signals and constructed and arranged to provide an output supply voltage signal that is different from the main supply voltage signal. The socket is constructed and arranged for interfacing with the voltage regulator module and includes a non-moveable member and a moveable member. The non-moveable member has a plurality of electrical conductors for connecting to the printed circuit board and a plurality of pin-contacting sections for receiving pins extending from the integrated circuit package. The moveable member is constructed and arranged adjacent the non-moveable member, and has a locked position for fixedly securing the integrated circuit package and the separate voltage regulator module and electrically connecting to the non-moveable member. The moveable member has an unlocked position for removing or inserting the integrated circuit package and the separate voltage regulator module. The moveable member also has a second plurality of pin-contacting sections aligned with the first plurality of pin-contacting sections of the non-moveable member, and a retaining arm, constructed and arranged to move in conjunction with the moveable member, for securing the separate voltage regulator module when the moveable member is in the locked position.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention will become apparent upon reading the following detailed description and upon reference to the drawings in which.

Figure 1:
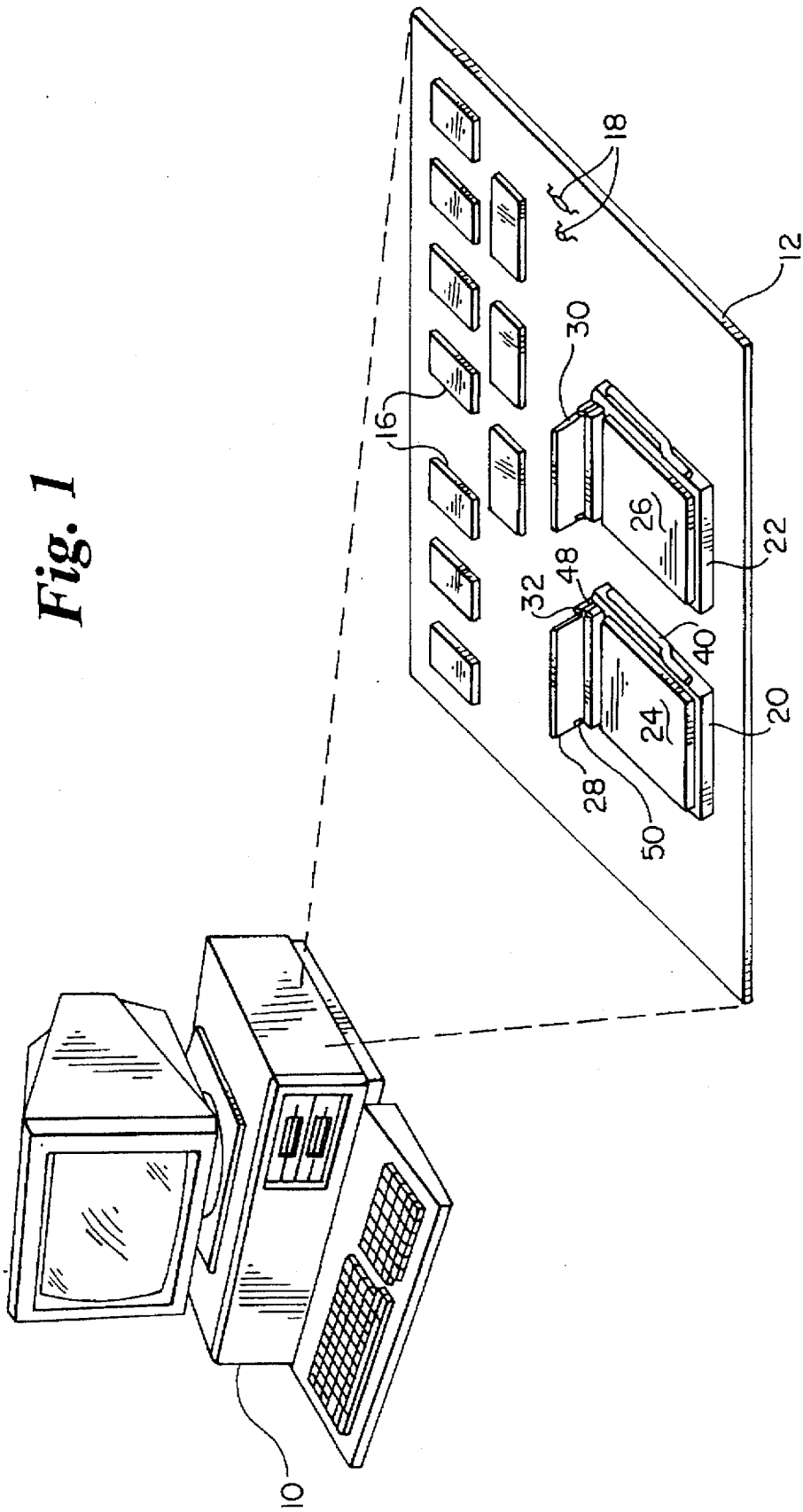
FIG. 1 is a perspective illustration of a desktop computer including a CPU printed circuit board constructed and designed in accordance with the principles of the present invention.

While the invention is susceptible to various modifications and alterative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention has a variety of applications in electronic computer-related products and systems requiring or benefiting from replacement of components. The present invention has been found to be especially applicable and advantageous in equipment using memory chips and microcomputers ("CPUs") requiring upgraded technology. This type of circuit design is used in desktop computers, as illustrated in FIG. 1 by reference numeral 10.

FIG. 1 illustrates both a perspective view of such a desktop computer 10 and an exploded view of the computer's internal main printed circuit board (PCB) 12. The main PCB 12 includes a variety of integrated circuit packages 16 as well as discrete components 18, some of which are shown for illustrative purposes. The main PCB further includes layers of electrical conductors (not shown) which are used to interconnect the integrated circuit packages and to connect the integrated circuit packages to the power signals (for example, +5 Volts and common).

Also shown in FIG. 1 on the main PCB 12 is a pair of sockets 20 and 22, each of which is implemented to embody the principles of the present invention. Each of these sockets 20 and 22 is shown securing an integrated circuit package 24 (or 26) and another separate electronic item 28 (or 30). The particular items shown to be secured in the socket 20 are a CPU 24 and a voltage regulator module 26.

The CPU 24 may be implemented using, for example, the PENTIUM CPU. ("PENTIUM" is a registered trademark owned by Intel Corporation). For such a CPU, the socket 20 includes hundreds of electrical conductors 25 (FIG. 2A) on the bottom side for soldering to the printed circuit board and the same number of pin-contacting apertures for receiving the same number of pins 27 (FIG. 2A) extending from the CPU 24.

The voltage regulator module 28 includes an electronic circuit supporting a voltage regulator IC (not shown) and connecting to a female socket 32. The female socket 32 has two rows of 15 pin-receptacles each. This set of pin receptacles is used to electrically connect, and partially secure, the voltage regulator module 28, via a corresponding set of connector pins 29 (FIGS. 2A and 2B) to the socket 20. The voltage regulator module 28 may be implemented as depicted in drawing number C-94-4163-078, available from AMP Incorporated.

The items shown to be secured in the socket 22 (which is constructed using the same principles as for the socket 20) include the same or a similar voltage regulator module 30, and integrated circuit package 26 can be implemented using a second CPU or a memory chip. The choice is specific to the application and, therefore, the particular design of the PCB 12.

An important aspect of the present invention is its minimization of space, parts and the number of levers that require manual engagement for holding the items within each socket. As shown in each of FIGS. 1, 2A and 2B, a single lever including a first axis 40 is used for holding both the CPU 24 and the voltage regulator module 28 within the socket 20. The lever is constructed and arranged to move within a non-moving member 36 of the socket 20, so that a moving member 38 (also part of the socket 20) moves laterally (from right to left from the perspective of FIGS. 2A and 2B).

Figure 2A:
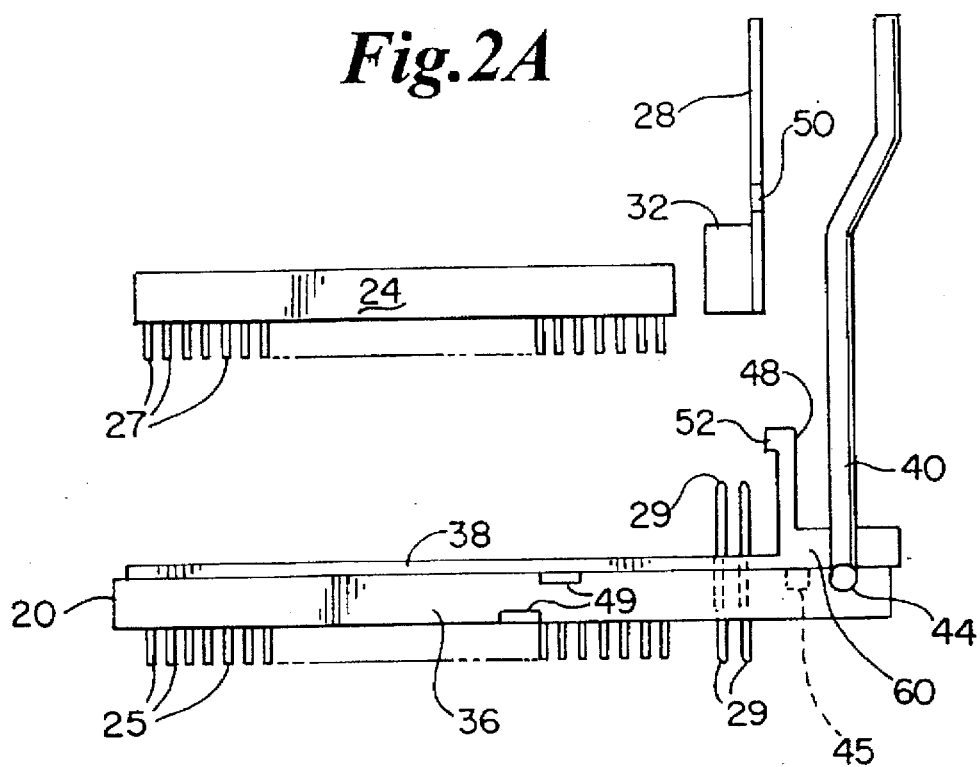
FIG. 2A is a pre-assembly drawing illustrating an exemplary implementation of a socket arrangement, shown from a side view, designed in accordance with the principles of the present invention.
Figure 2B:
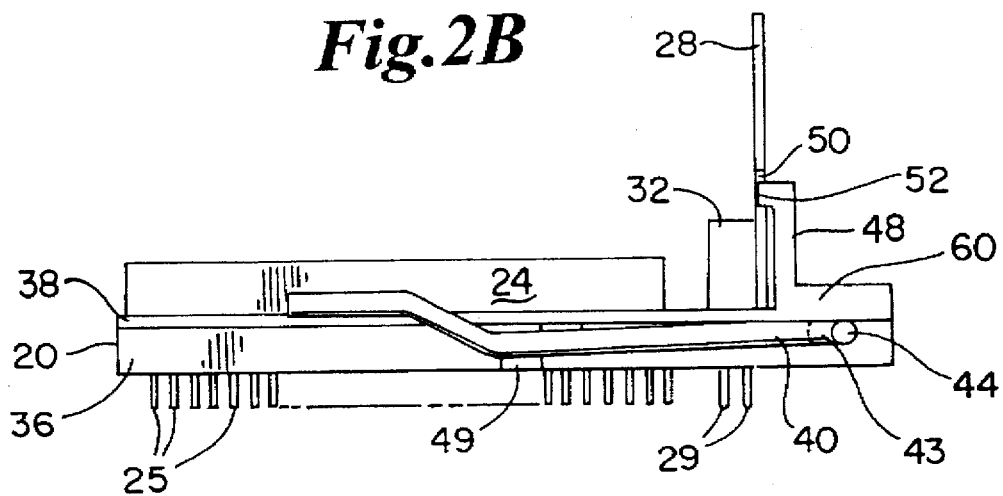
FIG. 2B is a drawing of the socket arrangement shown in FIG. 2A, also shown from a side view, but showing the post-assembly implementation in accordance with the principles of the present invention.

By manually rotating the first axis 40 counter-clockwise from an upright position, as shown in FIG. 2A, to a horizontal position, as shown in FIG. 2B, the status of the socket 20 is thereby converted from a removal/insertion (or unlocked) position to an item-secured (or locked) position. To effect this change in position, the lever includes a second axis 44 extending from the end of the first axis 40 into the socket (into the page as viewed from the perspective of FIGS. 2A and 2B). The offset portion 43 (FIG. 2B) of this second axis 44 is offset upwardly as viewed from the perspective of FIG. 2A (and to the left as viewed from the perspective of FIG. 2B). When the first axis 40 is rotated in the counterclockwise direction, the offset portion 43 of the second axis 44 engages an downwardly extending cam portion 45 (FIG. 2A), which extends down from the moving member. Because the cam portion is an integral part of the moving member 38, when the cam portion moves laterally, the entire moving member 38 moves laterally to provide locking tension on, and electrical connection with, the pins 27 extending from the CPU 24. The first axis 40 is then held in place using locking nubs 49 which extend outwardly from the side of the nonmoving member 36.

This type of cam action and lateral motion is conventional. For further details, reference may be made to the CPU socket implemented as part No. 916637-1 available from AMP Incorporated.

In accordance with the principles of the present invention, this rotation of the first axis 40 also causes the moving member 38 to secure the voltage regulator module 28 on the pins 29. As shown in FIG. 2A, the moving member 38 includes a pair of retaining arms 48 for interfacing an aperture (or cutout) 50 in each edge of the PCB portion of the voltage regulator module 28. Each retaining arm includes a shoulder 52 which is designed to fit into the aperture 50 for the purpose of holding the voltage regulator module 28 in its fully connected position, as shown in FIG. 2B. A reinforcing portion 60 of the moving member 38 is used to provide stability to the retaining arms 48.

Accordingly, with both the CPU 24 and the voltage regulator module 28 in place on the socket, moving the first (lever) axis 40 from the position shown in FIG. 2A in the counter-clockwise direction results in the firm retainment of both the CPU 24 and the voltage regulator module 28, with no other manual action or manual intervention required.

Figure 3:
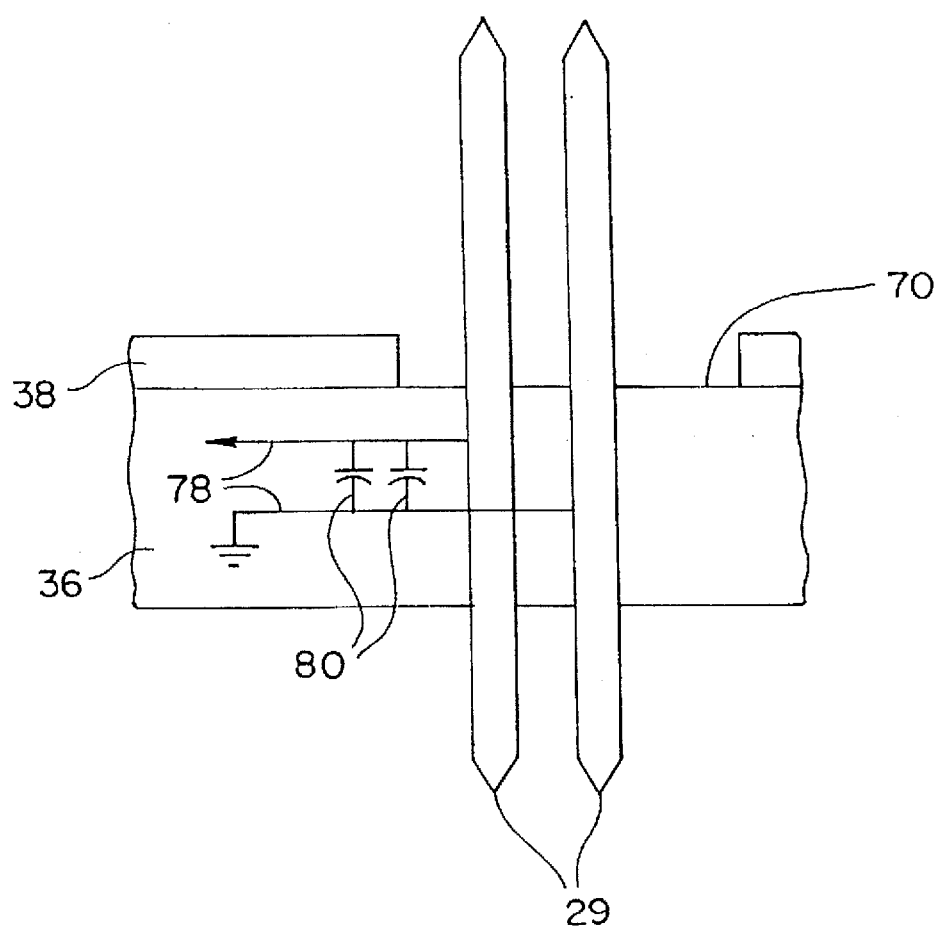
FIG. 3 is a partial side view of the socket arrangement shown in FIG. 2A, and illustrating aspects, in accordance with the principles of the present invention, which are not illustrated in the previous figures.

Referring now to FIG. 3, a cross-section of the socket 20 is illustrated with the location of the pins 29 being included as part of the non-moveable member 36 and through a receiving aperture 70 of the moving member 38. As the moving member 38 is moved laterally (from right to left), the aperture 70, which is surrounded by four edges/walls of the moving member, provides a gap so that the moving member can be guided laterally across the non-moving member without interference from the stationary structure associated with the retainment of the pins 29.

As an alternative arrangement, the pins 29 can be located and secured adjacent the opposite end as part, or secured to the main PCB independent, of the nonmoving member. In this alternative arrangement, the retaining arms 48 are located and secured at the top of the moving member. When the moving member is moved into the locked position, the shoulders 52 of the retaining arms 48 fit into the apertures 50 of the voltage regulator module 28.

With the pins 29 located and secured adjacent the end, but separate and independent, of the nonmoving member, the main PCB and the socket are designed such that the socket and the structure supporting the pins 29 are arranged closely next to one another. This optimizes the fit between the shoulders 52 of the retaining arms 48 and the apertures 50 of the voltage regulator module 28. Arranging the pins 29 separate from and independent of the nonmoving member provides for a multitude of different socket arrangements, including implementing the socket-buttressing end with a recess for receiving part or all of the structure supporting the pins 29 and implementing the socket-buttressing end without such a recess in which one edge of the socket buttresses one edge of the structure supporting the pins 29.

Implementing the pins 29 adjacent the end and as part of the nonmoving member, is also advantageous in that the socket 20 can be designed to include the electrical power conductors 78 for connecting the power pins of the CPU (or memory chip) to the power pins of the voltage regulator module. This is illustrated generally in FIG. 3.

Further, a decoupling capacitor circuit including, for example, a number of decoupling capacitors 80 can be included within (or on) the structure of the socket 20. An important advantage provided by arranging both the CPU (or memory chip) and the voltage regulator module closely together on the same socket 20 is that fewer decoupling capacitors 80 are needed.

The foregoing description, which has been disclosed by way of the above examples and discussion, addresses preferred embodiments of the present invention encompassing the principles of the present invention. As discussed above, the embodiments may changed, modified and/or implemented using various structures, circuit types and other arrangements. Those skilled in the art will readily recognize that these and various other modifications may be made to the present invention without strictly following the exemplary embodiments and applications illustrated and described herein. Such changes do not detract from the principles of the present invention, the metes and bounds of which are set forth in the following claims.

What is claimed is:

1. For use with a printed circuit board, a socket for removably retaining and electrically coupling an integrated circuit package and a separate electronic item, comprising:

a base unit for interfacing with the separate electronic item, including a non-moveable member and a moveable member;

the non-moveable member having a first plurality of electrical conductors for connecting to the printed circuit board and a first plurality of pin-contacting sections for receiving pins extending from the integrated circuit package;

the moveable member adjacent the non-moveable member, and having a locked position for fixedly securing the integrated circuit package and the separate electronic item and electronically connecting them to the non-moveable member, and having an unlocked position for removing the integrated circuit package and the separate electronic item;

the moveable member having a second plurality of pin-contacting sections aligned with the first plurality of pin-contacting sections of the non-moveable member, and a retaining arm to move in conjunction with the moveable member, for securing the separate electronic item when the moveable member is in the locked position.

2. A socket, according to claim 1, wherein the integrated circuit package is a central processing unit.

3. A socket, according to claim 2, wherein said separate electronic item is a voltage regulator module.

4. A socket, according to claim 3, wherein the non-moveable member includes a second plurality of electrical conductors for providing power connections between the voltage regulator module and the central processing unit.

5. A socket, according to claim 4, further including a lever constructed and arranged to move the moveable member from the unlocked position to the locked position in response to being manually engaged.

6. A socket, according to claim 4, further including a cam coupled to the lever, wherein the cam responds to engagement of the lever by moving the moveable member from the unlocked position to the locked position to secure and retain the integrated circuit package and the separate electronic item.

7. A socket, according to claim 4, wherein the non-moveable member further includes a decoupling capacitor circuit, including at least one decoupling capacitor connected between selected ones of the second plurality of electrical conductors.

8. A socket, according to claim 1, wherein the integrated circuit package is a memory module.

9. A socket, according to claim 1, wherein said separate electronic item is a voltage regulator module.

10. A socket, according to claim 1, wherein the non-moveable member further includes a second plurality of electrical conductors for providing power connections between the integrated circuit package and the separate electronic item.

11. A socket, according to claim 10, further including a lever constructed and arranged to move the moveable member from the unlocked position to the locked position in response to being manually engaged.

12. A socket, according to claim 1, wherein the base unit further includes a lever mechanism, including a manually operated lever, constructed and arranged to move the moveable member from the unlocked position to the locked position in response to being manually engaged.

13. A socket, according to claim 12, wherein the lever mechanism further includes a cam coupled to the lever, wherein the cam responds to engagement of the lever by moving the moveable member from the unlocked position to the locked position to secure and retain the integrated circuit package and the separate electronic item.

14. A socket, according to claim 1, wherein the base unit further includes a receptacle for receiving the separate electronic item and a set of pin-contacts arranged and constructed to connect with the separate electronic item.

15. A socket, according to claim 14, further including a decoupling capacitor circuit connected between certain of the pin-contacts.

16. A socket, according to claim 1, wherein the retaining arm includes a shoulder portion for securing an edge of the separate electronic item in the locked position.

17. A printed circuit board, comprising:

power conductors, including a first conductor for carrying a common signal and a second conductor for carrying a main supply voltage signal;

a plurality of integrated circuits connected to and operating from the power conductors;

a voltage regulator module connected to the common and main supply voltage signals to provide at least one output supply voltage signal that is different from the main supply voltage signal;

a socket for removably retaining an integrated circuit package and electrically coupling the integrated circuit package and the voltage regulator module, the socket for interfacing with the voltage regulator module and including a non-moveable member and a moveable member;

the non-moveable member having a plurality of electrical conductors for connecting to the printed circuit board and a first plurality of pin-contacting sections for receiving pins extending from the integrated circuit package;

the moveable member adjacent the non-moveable member, and having a locked position for fixedly securing the integrated circuit package and the voltage regulator module and for electrically connecting the integrated circuit package to the non-moveable member, and having an unlocked position for releasing the integrated circuit package and the voltage regulator module;

the moveable member having a second plurality of pin-contacting sections aligned with the first plurality of pin-contacting sections of the non-moveable member, and a retaining arm to move in conjunction with the moveable member, for securing the voltage regulator module when the moveable member is in the locked position.

18. A printed circuit board, according to claim 17, wherein the non-moveable member further includes a receptacle for receiving the voltage regulator module and electrical conductors for electrically connecting the integrated circuit package and the voltage regulator module.

19. For use with a printed circuit board, a socket for removably retaining and electrically coupling a CPU integrated circuit package and a voltage regulator module, comprising:

a non-moveable member having a plurality of electrical conductors for connecting to the printed circuit board and a first plurality of pin-contacting sections for receiving pins extending from the CPU integrated circuit package, and having a receptacle for receiving the voltage regulator module; and a moveable member adjacent the non-moveable member, and having a locked position for fixedly securing the CPU integrated circuit package and the voltage regulator module and electrically connecting them to the non-moveable member, and having an unlocked position for removing the CPU integrated circuit package and the voltage regulator module;

the moveable member having a second plurality of pin-contacting sections aligned with the first plurality of pin-contacting sections of the non-moveable member, and a retaining arm to move in conjunction with the moveable member, for securing the voltage regulator module when the moveable member is in the locked position.

20. A socket, according to claim 19, wherein the non-moveable member further includes a receptacle for receiving the voltage regulator module and electrical conductors for electrically connecting the integrated circuit package and the voltage regulator module.

21. For use in a printed circuit board (PCB), a socket for removably retaining a CPU integrated circuit package and a voltage regulator module with only one manually-engaged lever, the socket comprising:

a non-moveable member including only one manually-engaged lever and constructed and arranged to interface with the FCB and with the voltage regulator module; and a moveable member including a retaining arm for locking the voltage regulator module;

the non-moveable and moveable members to receive the CPU integrated circuit package;

the manually engaged lever being engaged for moving the moveable member from an unlocked position to a locked position for fixedly securing the CPU integrated circuit package, with the retaining arm securing the voltage regulator module.

* * * * *